(12) United States Patent
Jen et al.

(10) Patent No.: US 6,448,117 B1
(45) Date of Patent: Sep. 10, 2002

(54) TRI-LAYER PROCESS FOR FORMING TFT MATRIX OF LCD WITH GATE METAL LAYER AROUND PIXEL ELECTRODE AS BLACK MATRIX

(75) Inventors: Tean-Sen Jen, Chiai; Jia-Shyong Cheng, Hsinchu, both of (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/656,093

(22) Filed: Sep. 6, 2000

(30) Foreign Application Priority Data

Dec. 20, 1999 (TW) ........................................ 88122458 A (51) Int. Cl.[7] ........................ H01L 21/28; H01L 21/336
(52) U.S. Cl. ........................................ 438/160; 438/609
(58) Field of Search ................................. 438/149, 609, 438/160, FOR 201

(56) References Cited

U.S. PATENT DOCUMENTS

| | | | | |
|---|---|---|---|---|
| 4,704,623 A | * | 11/1987 | Piper et al. | 357/23.7 |
| 4,778,258 A | * | 10/1988 | Parks et al. | 350/336 |
| 4,873,516 A | * | 10/1989 | Castleberry | 340/784 |
| 5,346,833 A | | 9/1994 | Wu | |
| 5,462,885 A | * | 10/1995 | Nasu et al. | 148/DIG. 150 |
| 5,478,766 A | | 12/1995 | Park et al. | |
| 5,757,058 A | * | 5/1998 | Song | 257/449 |
| 5,963,797 A | * | 10/1999 | Hyun | 438/149 |
| 5,968,850 A | * | 10/1999 | Jeong et al. | 216/102 |
| 5,989,945 A | * | 11/1999 | Yudasaka et al. | 438/149 |
| 6,066,506 A | * | 5/2000 | Holmberg et al. | 438/4 |
| 6,218,221 B1 | * | 4/2001 | Sah | 438/158 |
| 6,221,702 B1 | * | 4/2001 | Joo et al. | 438/166 |
| 6,300,988 B1 | * | 10/2001 | Ishihara et al. | 257/59 |

* cited by examiner

Primary Examiner—George Fourson
Assistant Examiner—Suk-San Foong
(74) Attorney, Agent, or Firm—J. Warren Whitesel; Michael Best & Friedrich LLC (57) ABSTRACT

A simplified tri-layer process for forming a thin film transistor matrix for a liquid crystal display is disclosed. By forming a pixel electrode layer before a gate metal layer, a remaining portion of the gate metal layer surrounding the pixel electrode can function as a black matrix after properly patterning and etching the gate metal layer. The in-situ black matrix exempts from an additional step of providing a black matrix and solves the problem in alignment.

17 Claims, 12 Drawing Sheets

TRI-LAYER PROCESS FOR FORMING TFT MATRIX OF LCD WITH GATE METAL LAYER AROUND PIXEL ELECTRODE AS BLACK MATRIX

FIELD OF THE INVENTION

The present invention relates to a process for forming a thin film transistor (TFT) matrix for a liquid crystal display (LCD), and more particularly to a simplified tri-layer process for forming the TFT matrix with reduced masking steps. A part of gate metal layer around pixel electrodes functions as a black matrix.

BACKGROUND OF THE INVENTION

For conventional manufacturing processes of a TFTLCD, a tri-layer process and a back channel etch (BCE) process are main streams for forming the TFT matrix. Compared to a BCE structure, a tri-layer structure additionally includes an top nitride over the semiconductor layer as an etch stopper so that the etching step for defining a source/drain and channel region can be well controlled. Accordingly, the thickness of the active layer can be made to be thinner in the tri-layer structure than in the BCE structure, which is advantageous for the stability of resulting devices and performance in mass production. However, the provision of the additional etch stopper layer needs an additional masking step, thereby making the tri-layer process relatively complicated.

Conventionally, six to nine masking steps are required for either a BCE process or a tri-layer process. After the formation of the TFT matrix, a step of providing a black matrix around each pixel electrode region is generally required to improve the performance of the LCD. The provision of the black matrix after the process, however, will have difficulty in alignment.

On the other hand, the count of photo-masking and lithography steps directly affects not only the production cost but also the manufacturing time. Moreover, for each photo-masking and lithography step, the risks of misalignment and contamination may be involved so as to affect the production yield. Therefore, many efforts have been made to improve the conventional processes to reduce masking steps.

For example, for a BCE structure, U.S. Pat. Nos. 5,346,833 and 5,478,766 issued to Wu and Park et al., respectively, disclose 3 and/or 4-mask processes for making a TFTLCD, which are incorporated herein for reference. By the way, it is to be noted that the 3-mask process for each of Wu and Park et al. does not include the step of forming and patterning of a passivation layer. If a passivation layer is required to assure of satisfactory reliability, the count of photo-masking and lithography steps should be four. Further, Wu and Park et al. use an ITO layer, which is integrally formed with the ITO pixel electrode, as the connection line between the TFT unit and the data line so that the area of the TFTLCD is limited due to the high resistivity of ITO.

Figure 1A:
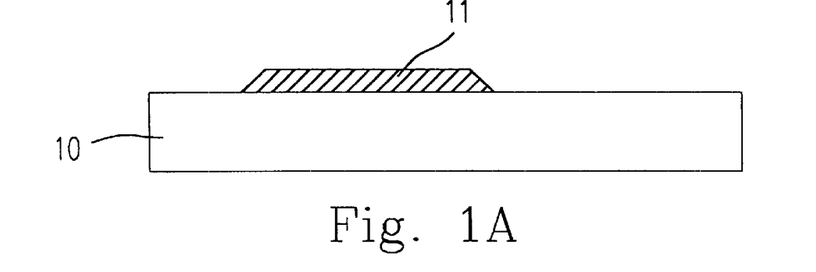
FIGS. 1A~1G are cross-sectional views of intermediate structures of a conventional TFTLCD, which schematically show the formation of the TFT matrix.
Figure 1B:
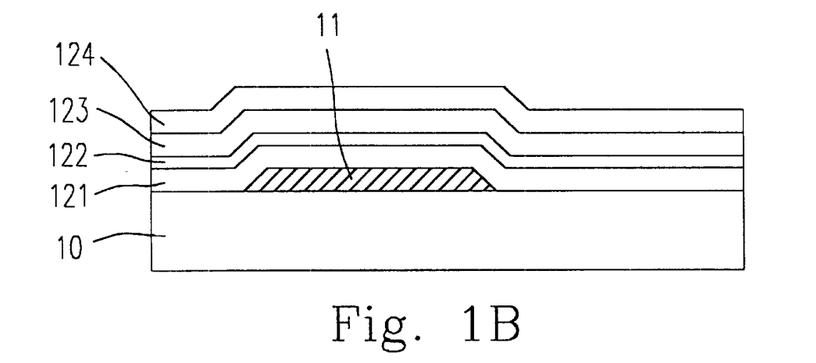
Figure 1C:
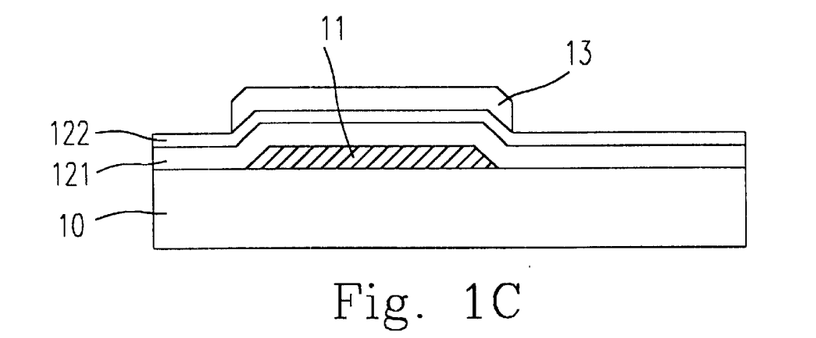
Figure 1D:
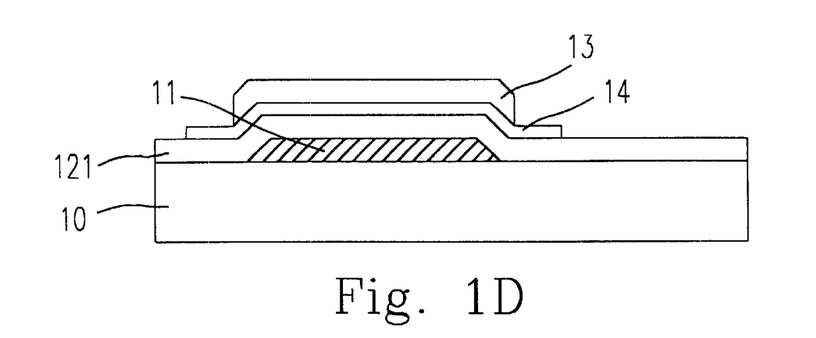
Figure 1E:
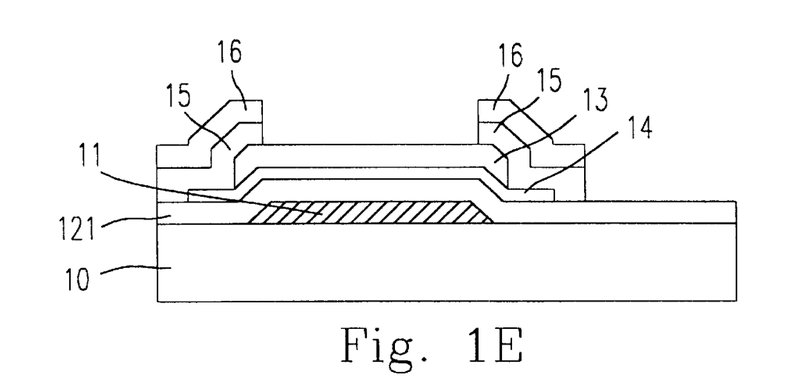
Figure 1F:
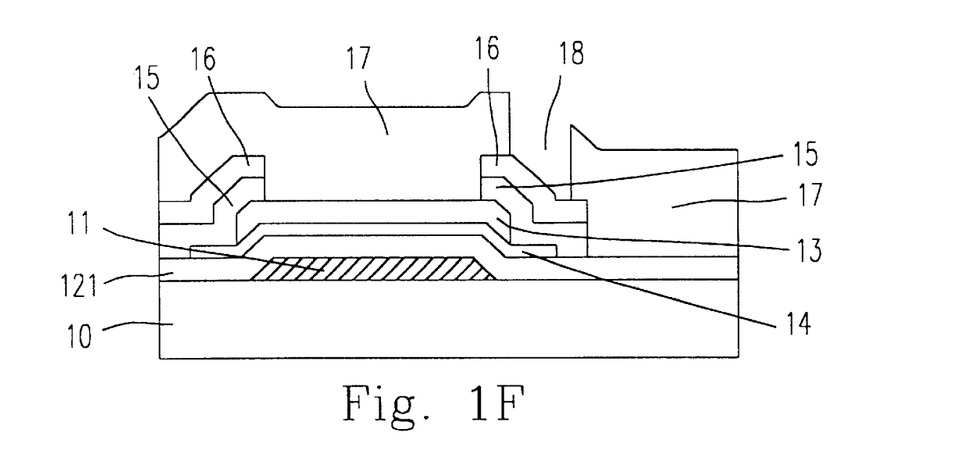
Figure 1G:
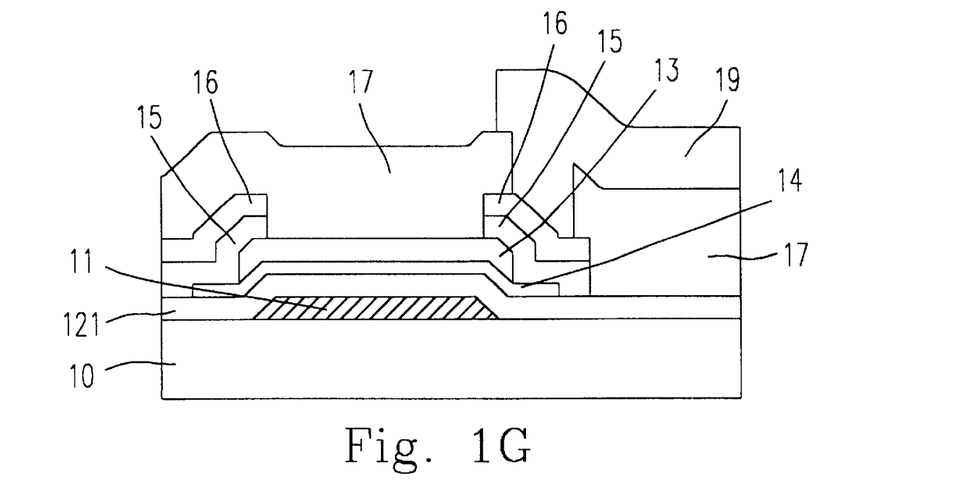

As for the tri-layer structure, a conventional 6-mask process is illustrated as follows with reference to FIGS. 1A–1G which are cross-sectional views of intermediate structures at different stages. The conventional process includes steps of:

i) applying a first conductive layer onto a glass substrate 10, and using a first photo-masking and lithography procedure to pattern and etch the first conductive layer to form an active region 11 consisting of a scan line and a gate electrode of a TFT unit, as shown in FIG. 1A;

ii) sequentially forming tri-layers including an insulation layer 121, a semiconductor layer 122 and an etch stopper layer 123, and a photoresist 124 on the resulting structure of FIG. 1A, as shown in FIG. 1B.

iii) using a second photo-masking and lithography procedure to pattern and etch the etch stopper layer 123 to form an etch stopper 13 which have a shape similar to the shape of the gate electrode, as shown in FIG. 1C;

iv) using a third photo-masking and lithography procedure to pattern and etch the semiconductor layer 122 to form a channel structure 14, as shown in FIG. 1D;

v) sequentially applying a doped semiconductor layer and a second conductive layer on the resulting structure of FIG. 1D, and using a fourth photo-masking and lithography procedure to pattern and etch them to form source/drain regions 15 and data and connection lines 16, as shown in FIG. 1E;

vi) applying a passivation layer 17 on the resulting structure of FIG. 1E, and using a fifth photo-masking and lithography procedure to pattern and etch the passivation layer 17 to create tape automated bonding (TAB) openings (not shown), and create a contact window 18, as shown in FIG. 1F; and vii) applying a transparent electrode layer on the resulting structure of FIG. 1F, and using a sixth photo-masking and lithography procedure to pattern and etch the transparent electrode layer to form a pixel electrode 19, as shown in FIG. 1G.

Six masking steps, however, are still too complicated.

SUMMARY OF THE INVENTION

Therefore, an object of the present invention is to provide a reduced mask process for forming a thin film transistor (TFT) matrix for a liquid crystal display (LCD), in which the count of photo-masking and lithography steps can be reduced to four.

Another object of the present invention is to provide a simplified process for forming a thin film transistor (TFT) matrix for a liquid crystal display (LCD), in which a part of gate metal layer around a pixel electrode functions as a black matrix.

A further object of the present invention is to provide a tri-layer process for forming a thin film transistor (TFT) matrix for a liquid crystal display (LCD), in which the connection line between a TFT unit and a data line has a relatively low resistivity compared to the ITO connection line so as to be suitable for a large-area TFTLCD.

According to a first aspect of the present invention, a process for forming a thin film transistor (TFT) matrix for a liquid crystal display (LCD) includes steps of providing a substrate made of an insulating material; successively forming a transparent conductive layer and a first conductive layer on a first side of the substrate, and using a first masking and patterning procedure to remove portions of the transparent conductive layer and the first conductive layer to define a pixel electrode area, a scan line and a gate electrode of a TFT unit; successively forming an insulation layer, a semiconductor layer, an etch stopper layer, and a photoresist layer on the first side of the substrate; providing an exposing source from a second side of the substrate opposite to the first side by using a remaining portion of the first conductive layer as shields to obtain an exposed area and an unexposed area; removing the photoresist, the etch stopper layer and the semiconductor layer of the exposed area so that the remaining portions of the etch stopper layer and the semiconductor layer in the unexposed area have a specific shape substantially identical to the shape of the remaining portion of the first conductive layer, by which a channel region is defined; using a second masking and patterning procedure to further remove portions of the etch stopper layer, the semiconductor layer and the insulation layer to form a contact via accessible to the first conductive layer; successively forming a doped semiconductor layer and a second conductive layer on the substrate, and using a third masking and patterning procedure to remove portions of the second conductive layer and the doped semiconductor layer to define data and connection lines and source/drain regions of the TFT unit; and forming a passivation layer on the substrate, and using a fourth masking and patterning procedure to remove portions of the passivation layer, the etching stopper layer, the semiconductor layer and the insulation layer in the pixel electrode area to expose the transparent conductive layer as a pixel electrode.

When the exposing source is a light radiation, the insulating material is a light-transmitting material such as glass.

Preferably, the first conductive layer and the second conductive layer are formed of chromium, molybdenum, tantalum molybdenum, tungsten molybdenum, tantalum, aluminum, aluminum silicide or copper. More preferably, a specific etching selectivity between the first conductive layer and the second conductive layer prevents the first conductive layer from being etched by an etchant of the second conductive layer. For example, the first conductive layer is formed of chromium or tungsten molybdenum, and the second conductive layer is formed of aluminum.

Preferably, the insulation layer is formed of silicon nitride, silicon oxide, silicon oxynitride, tantalum oxide or aluminum oxide.

Preferably, the semiconductor layer is formed of intrinsic amorphous silicon, micro-crystalline silicon or polysilicon.

Preferably, the etch stopper layer is formed of silicon nitride, silicon oxide or silicon oxynitride.

Preferably, the doped semiconductor layer is formed of highly amorphous silicon, highly micro-crystalline silicon or highly polysilicon.

Preferably, the transparent conductive layer is formed of indium tin oxide, indium zinc oxide or indium lead oxide.

Preferably, the passivation layer is formed of silicon nitride or silicon oxynitride.

After the fourth masking and patterning procedure, it is preferred that a portion of the first conductive layer surrounding the pixel electrode remains as a black matrix.

Preferably, a plurality of pad regions around the TFT matrix are defined in the first masking and patterning procedure, and the second masking and patterning procedure additionally defines a plurality of contact via to expose the pad regions.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following description of the preferred embodiment of this invention is presented herein for purpose of illustration and description only; it is not intended to be exhaustive or to be limited to the precise form disclosed.

Figure 2A:
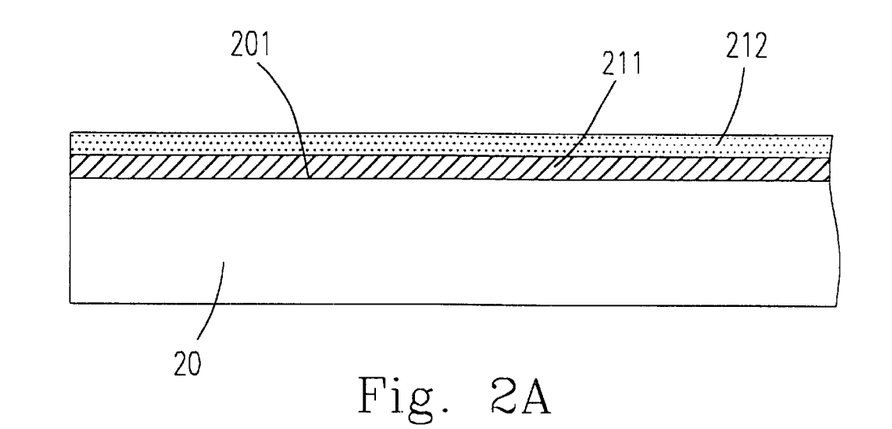
FIGS. 2A~2H are cross-sectional views of intermediate structures of a TFTLCD according to the present invention, which schematically show a preferred embodiment of a process for forming the TFT matrix.
Figure 2B:
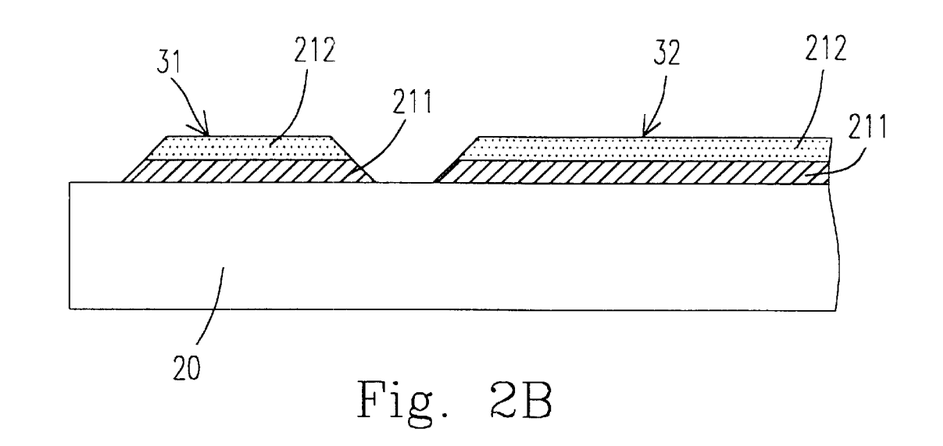
Figure 2C:
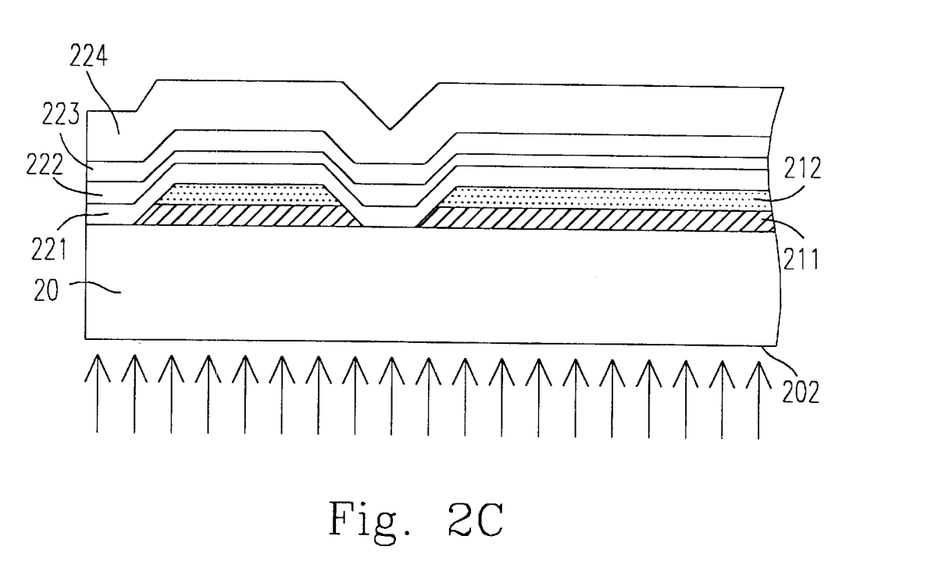
Figure 2D:
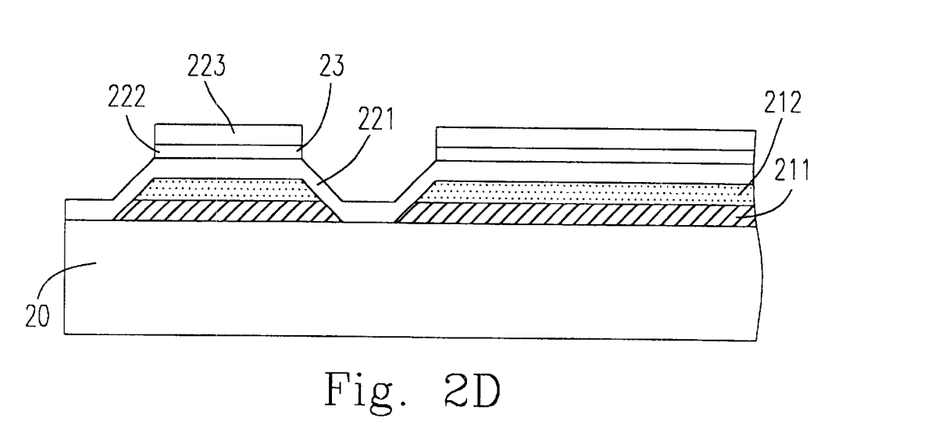
Figure 2E:
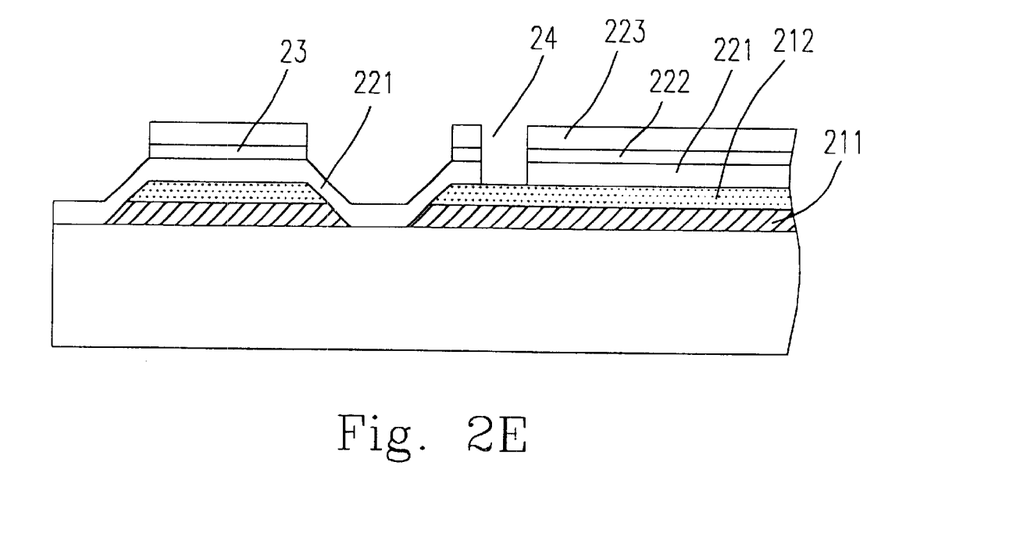
Figure 2F:
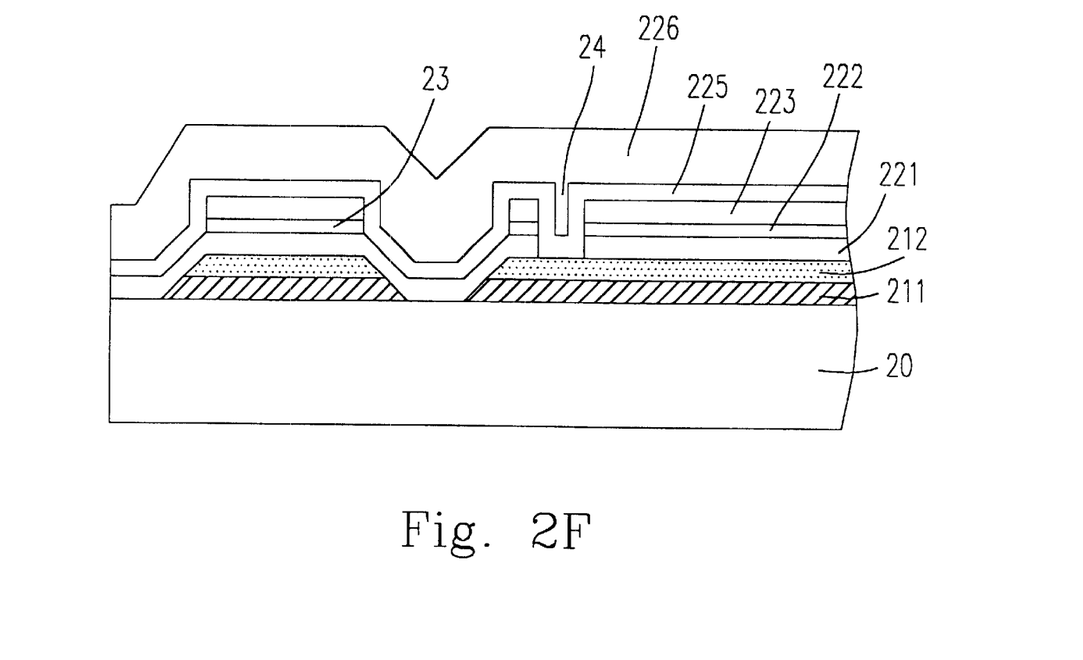
Figure 2G:
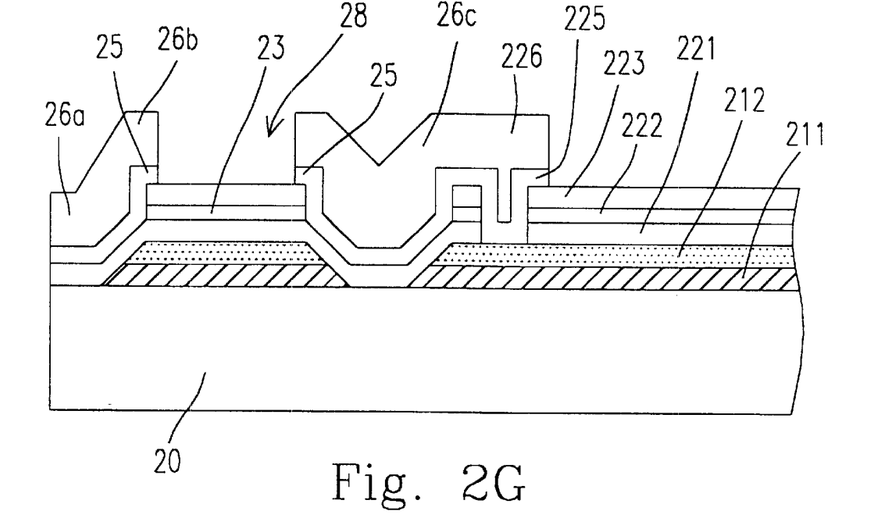
Figure 2H:
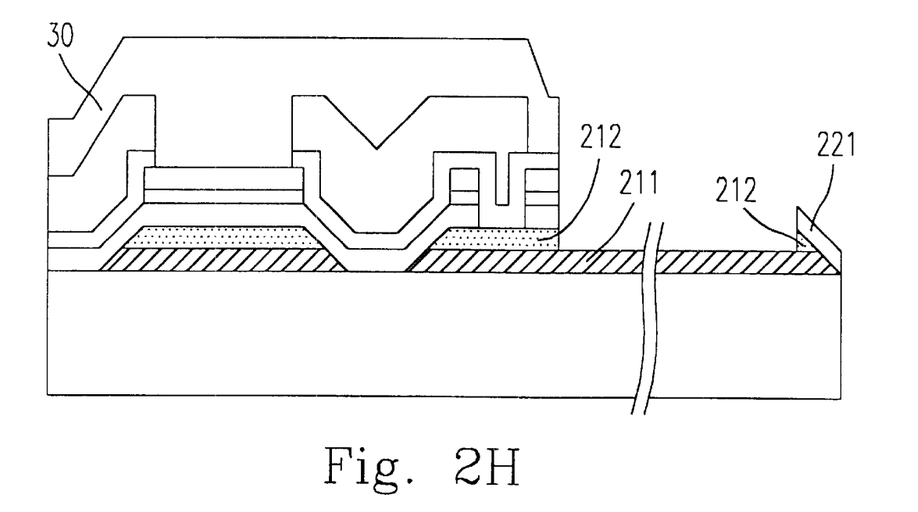
Figure 3A:
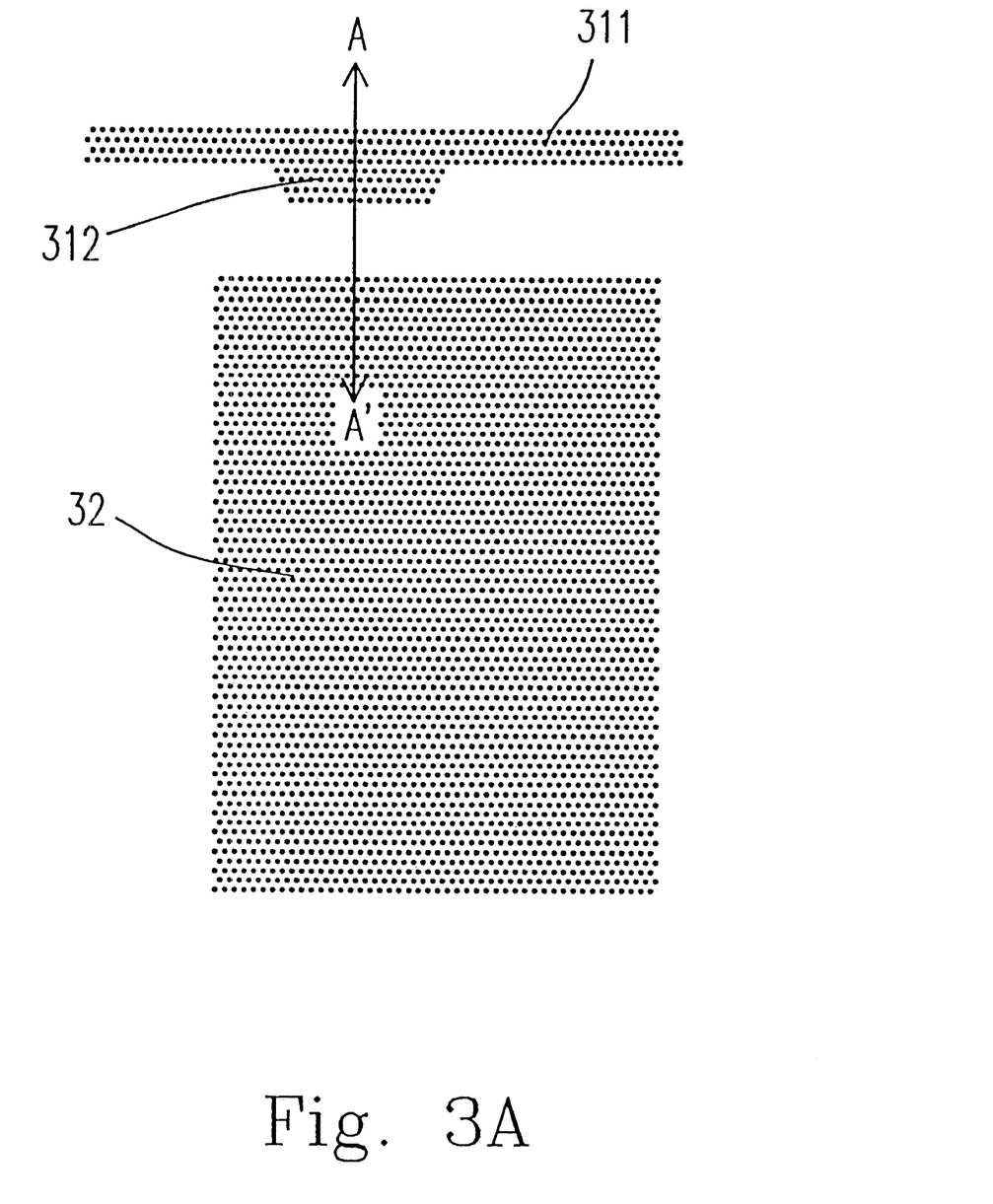
FIGS. 3A~3D are partial top plane views corresponding to the structures of FIG. 2B, 2E, 2G and 2H, respectively.
Figure 3B:
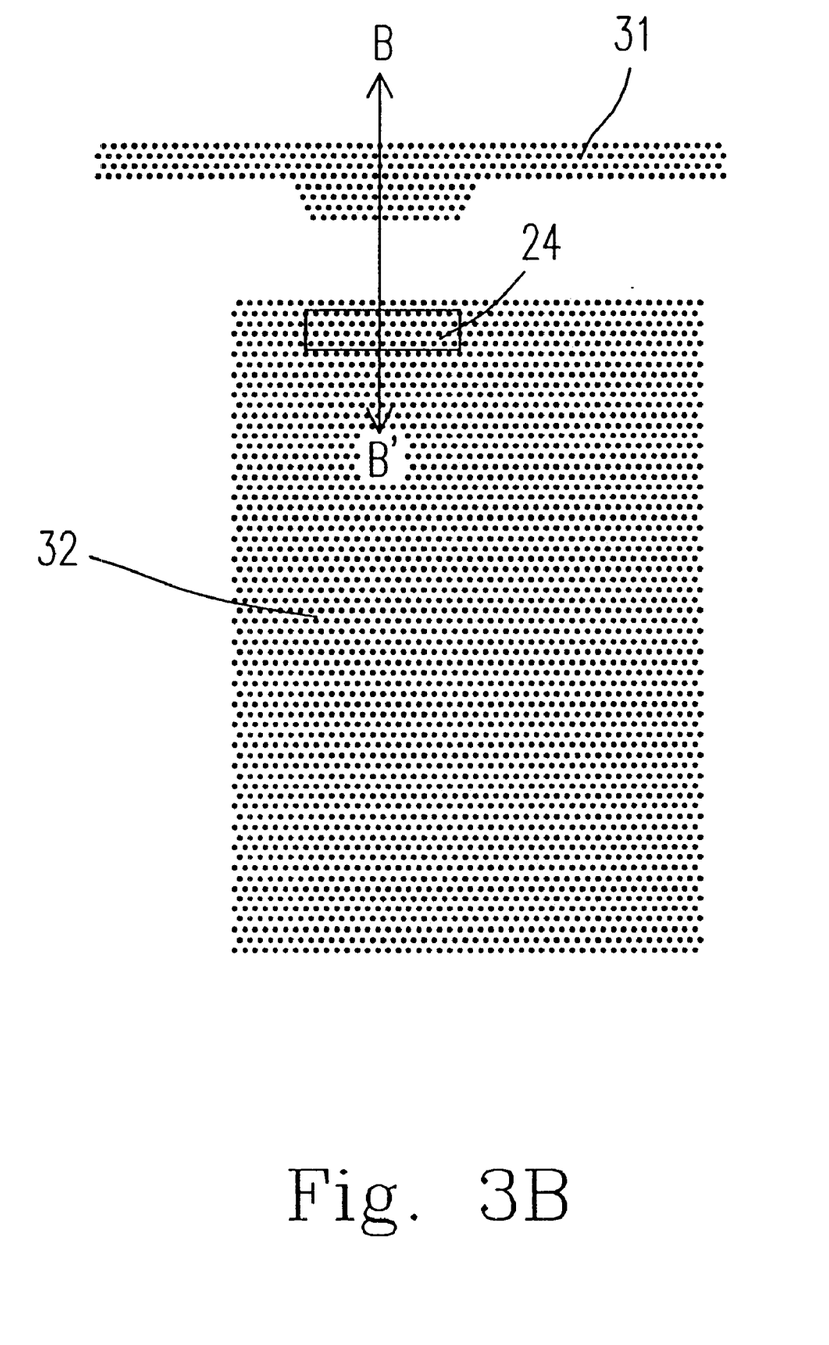
Figure 3C:
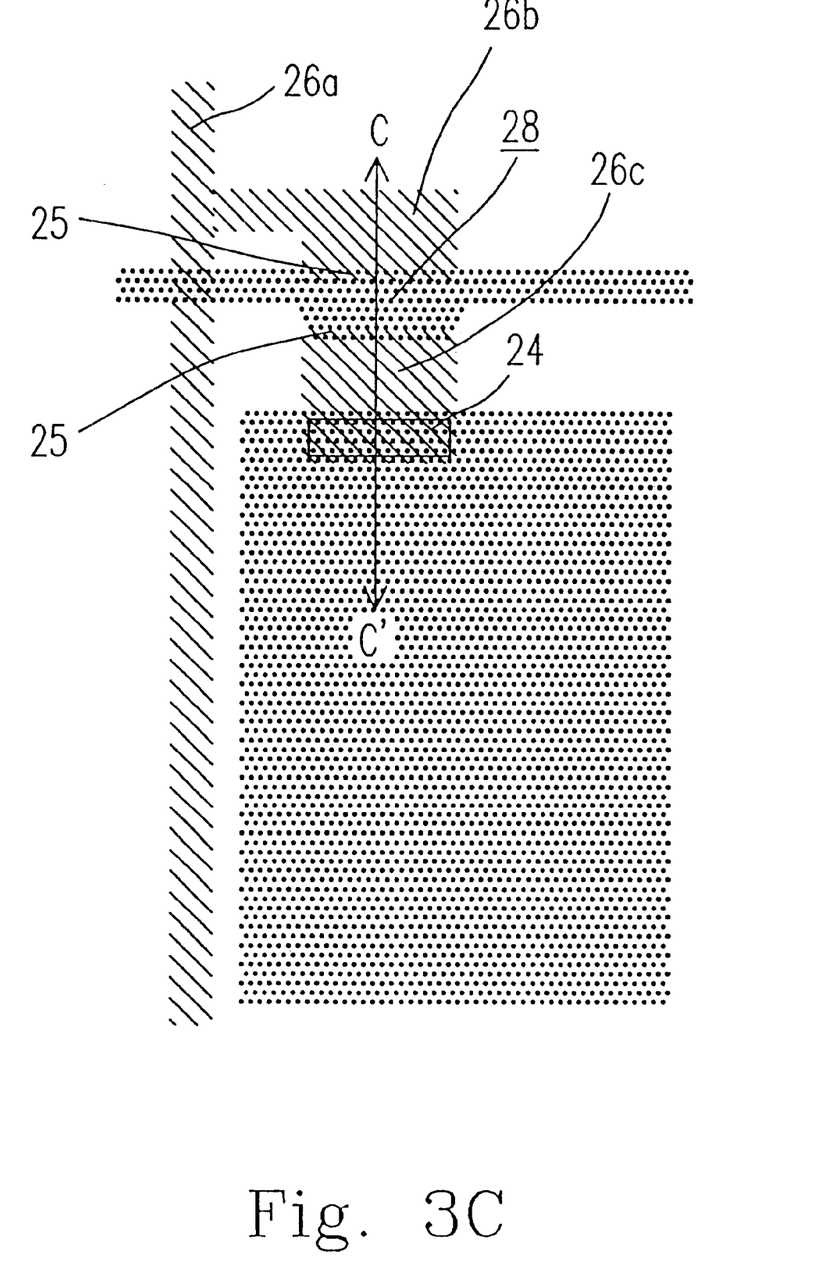
Figure 3D:
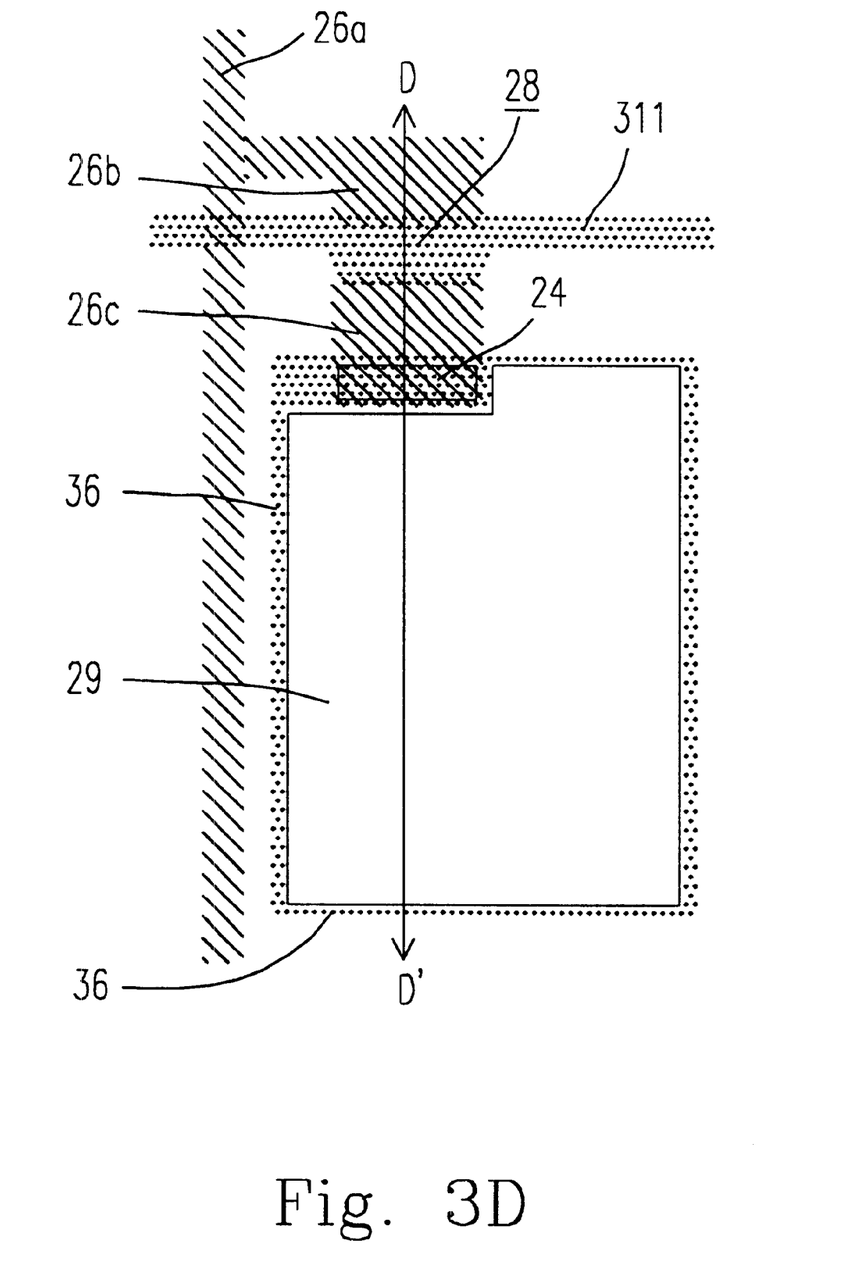
Figure 4A:
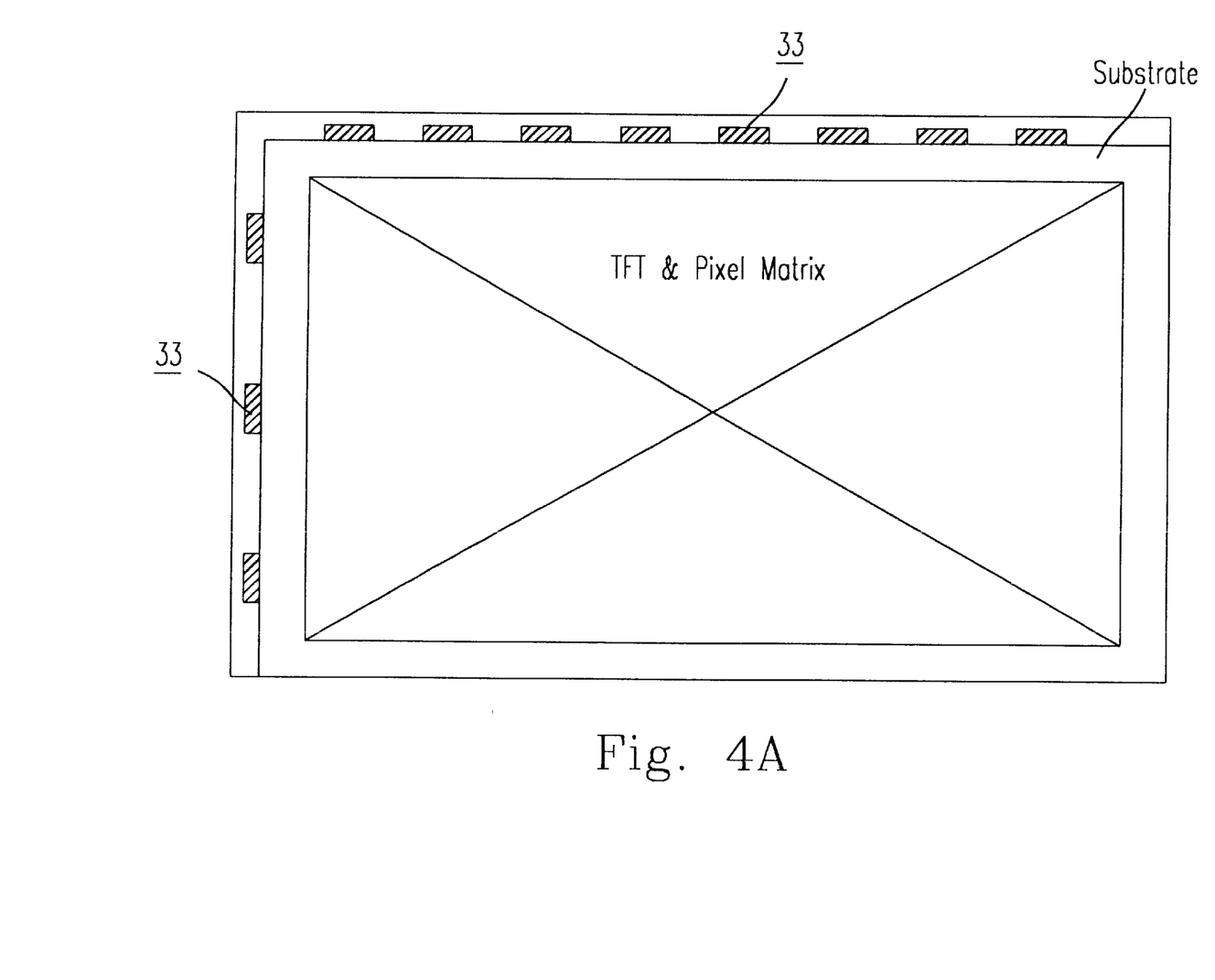
FIG. 4A is a partial top plane view schematically showing a pad region for the scan lines and the data lines around the TFT matrix of a TFTLCD.
Figure 4B:
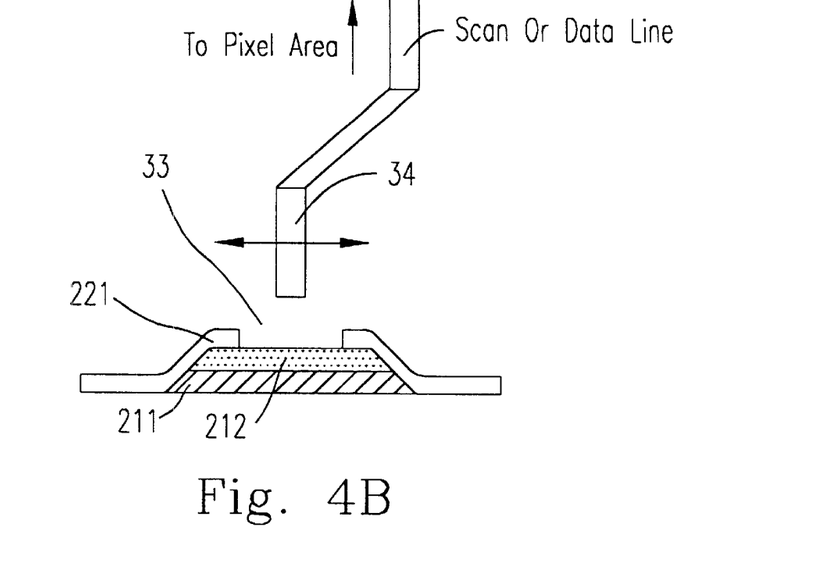
FIGS. 4B and 4C are partially cross-sectional views of intermediate structures in the pad region of FIG. 4A.
Figure 4C:
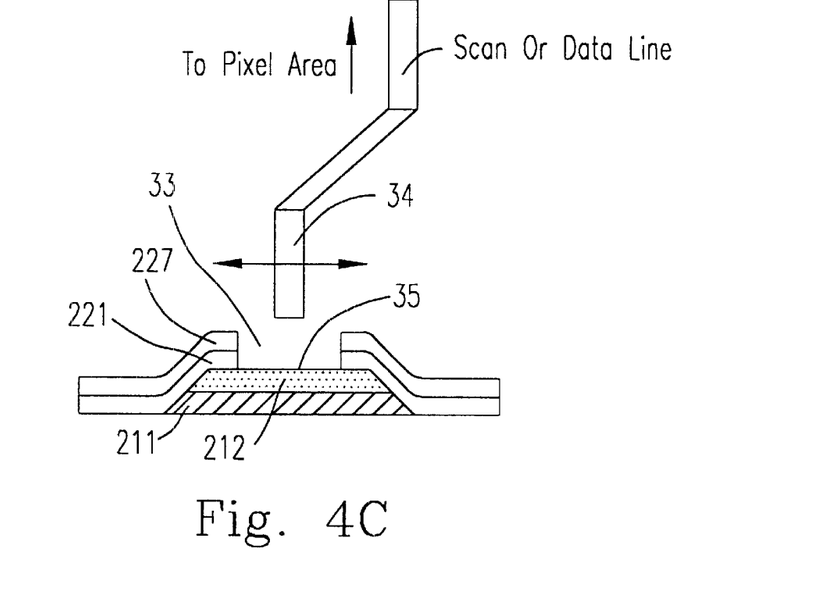

A preferred embodiment of a process for forming a TFT matrix of a TFTLCD according to the present invention directs to a four-mask process, and it is illustrated with reference to FIGS. 2A~2H. It is to be noted that the division of steps and the provision of serial numbers as below are for corresponding to the drawings, and for easy illustration and understanding, instead of critically indicating the separation or the integration of steps. The preferred embodiment of the process includes steps of:

i) consecutively and sequentially forming an ITO layer 211 and a Cr layer 212 onto a front side 201 of a glass substrate 20 as a transparent conductive layer and a first conductive layer, respectively, as shown in FIG. 2A;

ii) using a first photo-masking and lithography procedure to pattern and etch the dual ITO and Cr layers to define an active region 31 consisting of a scan line 311 and a gate electrode 312 of a TFT unit, an electrode pixel area 32, and a pad region 33 as shown in FIGS. 2B, 3A and 4A wherein FIG. 2B is a cross-sectional view taken along the 2B—2B line of FIG. 3A;

iii) consecutively and sequentially forming a silicon nitride layer 221 as an insulation layer, an intrinsic amorphous silicon (i—a—Si) layer 222 as a semiconductor layer, a top silicon nitride layer 223 as an etch stopper layer, and a photoresist 224 on the resulting structure of FIG. 2B, as shown in FIG. 2C, and exposing the resulting structure from the back side 202 of the substrate 20, as indicated by arrows, wherein a portion of the photoresist 224 is shielded by the remaining Cr layer 31+32+33 thereunder from exposure so as to exhibit a self-aligned effect;

iv) etching off the exposed photoresist 224, portions of the top silicon nitride layer 223 and i—a—Si layer 222 thereunder, and the remaining photoresist so that the remaining top silicon nitride layer 223 has a shape substantially identical to the united regions 31+32+33 as well as the remaining i—a—Si layer, thereby defining a channel structure 23, as shown in FIG. 2D;

v) using a second photo-masking and lithography procedure to pattern and etch the structure of FIG. 2D to remove portions of the top silicon nitride layer 223, i—a—Si layer 222 and silicon nitride layer 221 to create a contact via 24 in the pixel electrode area 32 and a contact via 34 in the pad region to expose the Cr layer 212, as shown in FIGS. 2E, 3B and 4B, wherein FIG. 2E is a cross-sectional view taken along the 2E—2E line of FIG. 3B, and FIG. 4B is a partially cross-sectional view of the pad region 33;

vi) sequentially applying an n$^+$ amorphous silicon layer 225 and an Al layer 226 on the resulting structure of FIG. 2E as a highly doped semiconductor layer and a second conductive layer, respectively, as shown in FIG. 2F;

vii) using a third photo-masking and lithography procedure to pattern and etch the dual Al and n+ amorphous silicon layers 226 and 225 to define source/drain regions 25 and data and connection lines 26, as shown in FIGS. 2G and 3C wherein FIG. 2G is a cross-sectional view taken along the 2G—2G line of FIG. 3C;

viii) applying a silicon nitride layer 227 on the resulting structure of FIG. 2H as a passivation layer, and using a fourth photo-masking and lithography procedure to pattern and etch all the layers above the ITO layer 212 in the pixel electrode area 32 so as to expose the ITO pixel electrode 29, as shown in FIGS. 2H and 3D wherein FIG. 2H is a cross-sectional view taken along the 2H—2H line of FIG. 3D, and simultaneously remove the passivation layer in the contact via 34 to expose the Cr layer 212 and thus form a TAB pad 35, as shown in FIG. 4C which is another partially cross-sectional view of the pad region 33.

In the step i) of the above embodiment, the transparent conductive layer 211 and the first conductive layer 212 can be applied by any suitable conventional technique which is not to be redundantly described here. In this embodiment, the substrate 20 is formed of glass which is transparent for allowing light type of exposing source to transmit therethrough. The substrate 20, however, can also be made of another transparent, translucent or opaque material, depending on the type of the exposing source. The transparent conductive layer 211 can also be formed of indium zinc oxide or indium lead oxide. The first conductive layer 212 can also be formed of molybdenum, tantalum molybdenum, tungsten molybdenum, tantalum, aluminum, aluminum silicide or copper.

In the step ii) of the above embodiment, the photo-masking and lithography procedure can be performed by any suitable conventional technique which is not to be redundantly described here.

In the step iii) of the above embodiment, the insulation layer 221, semiconductor layer 222, etch stopper layer 223 and photoresist 224 can be applied by any suitable conventional techniques which are not to be redundantly described here. The insulation layer 221 can also be formed of silicon oxide, silicon oxynitride, tantalum oxide or aluminum oxide. The semiconductor layer 222 can also be formed microcrystalline silicon or polysilicon. The etch stopper layer 223 can also be formed of silicon oxide or silicon oxynitride.

In the step iv) of the above embodiment, the etching procedure can be performed by any suitable conventional technique which is not to be redundantly described here.

In the step v) of the above embodiment, the photo-masking and lithography procedure can be performed by any suitable conventional technique which is not to be redundantly described here.

In the step vi) of the above embodiment, the highly doped semiconductor layer 225 and the second conductive layer 226 can be applied by any suitable conventional techniques which are not to be redundantly described here. In this embodiment, the highly doped semiconductor layer 225 can also be formed of n+ micro-crystalline silicon or n+ polysilicon. The second conductive layer 226 can also be formed of chromium, molybdenum, tantalum molybdenum, tungsten molybdenum, tantalum, aluminum silicide or copper.

It is to be noted that the first conductive layer 212 in the pad region 33 is likely to be etched off during the step vii) for etching the second conductive layer 226 if the first and the second conductive layers are made of the same material or one has a low etching selectivity to the other. Then, only the transparent conductive layer 211 remains as contact for electric conduction. As known, a general transparent conductive layer such as ITO has a high resistivity so that the electric property of the contact is relatively poor. Therefore, there preferably exists a high etching selectivity between the second conductive layer 226 and the first conductive layer 212 so that the etching procedure of the second conductive layer will not damage the first conductive layer during the formation of TAB pads.

In the step vii) of the above embodiment, the photo-masking and lithography procedure and the etching procedure can be performed by any suitable conventional techniques which are not to be redundantly described here. The TFT unit 28 is accomplished after this step. The term "data and connection lines" used herein includes a data line 26a, a first connection line 26b and a second connection line 26c, wherein the first connection line 26b connects the data line 26a and the TFT unit 28, and the second connection line 26c connects the TFT unit 28 and the electrode pixel 29.

In the step viii) of the above embodiment, the passivation layer 227 can be applied by any suitable conventional technique which is not to be redundantly described here. The passivation layer 227 can also be formed of silicon oxynitride. On the other hand, the photo-masking and lithography procedure can be performed by any suitable conventional technique which is not to be redundantly described here.

According to the process mentioned above, the patterning of the transparent conductive layer 211 and the etch stopper layer 212 is performed by a backside exposure technique as disclosed in the step iii), which uses the remaining first conductive layer 212 as shields so that one masking step is omitted. Further, in this embodiment, the transparent conductive layer is formed before the first conductive layer rather than after the passivation layer. Therefore, an additional masking and patterning procedure for creating the contact via 34 can be omitted. In other words, in this embodiment, only four masking and patterning procedures are required.

It is understood that the masking count can be further reduced to three by omitting the passivation layer if reliability is not taken into consideration.

Furthermore, the connection lines 26b and 26c are integrally formed with the data line 26a so as to be of the same material as the data line 26a, i.e. Al in the illustrative embodiment. Therefore, the connection line 26c has a relatively low resistivity compared to the ITO connection line so as to be suitable for a large-area TFTLCD.

Moreover, there is an additional advantage by having the transparent conductive layer formed before the first conductive layer. After a portion of the first conductive layer is further removed after the fourth masking and patterning procedure, a remaining portion of the first conductive layer surround the pixel electrode can function as black matrix 36, as shown in FIG. 3D.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for reducing the number of masks used to form a thin film transistor (TFT) matrix for a liquid crystal display (LCD), comprising steps of:

providing a substrate made of an insulating material;

successively forming a transparent conductive layer and a first conductive layer on a first side of said substrate, and using a first masking and patterning procedure to remove portions of said transparent conductive layer and said first conductive layer to define a pixel electrode area, a scan line and a gate electrode of a TFT unit;

successively forming an insulation layer, a semiconductor layer, an etch stopper layer, and a photoresist layer on said first side of said substrate;

providing an exposing source from a second side of said substrate opposite to said first side by using a remaining portion of said first conductive layer as shields to obtain an exposed area of said photo resist layer and an unexposed area of said photo resist layer;

removing said exposed photoresist, using the remaining portion of said photoresist as a mask removing said etch stopper layer and said semiconductor layer of said exposed area so that the remaining portions of said etch stopper layer and semiconductor layer in said unexposed area have a specific shape substantially identical to the shape of said remaining portion of said first conductive layer, by which a channel region is defined;

using a second masking and patterning procedure to further remove portions of said etch stopper layer, said semiconductor layer and said insulation layer to form a contact via accessible to said first conductive layer;

successively forming a doped semiconductor layer and a second conductive layer on said substrate, and using a third masking and patterning procedure to remove portions of said second conductive layer and said doped semiconductor layer to define data and connection lines and source/drain regions of said TFT unit; and forming a passivation layer on said substrate, and using a fourth masking and patterning procedure to remove portions of said passivation layer; said etching stopper layer, said semiconductor layer and said insulation layer in said pixel electrode area to expose said transparent conductive layer as a pixel electrode.

2. The process according to claim 1 wherein said insulating material is a light-transmitting material, and said exposing source is a light radiation.

3. The process according to claim 2 wherein said light-transmitting material is glass.

4. The process according to claim 1 wherein said transparent conductive layer is formed of a material selected from a group consisting of indium tin oxide, indium zinc oxide and indium lead oxide.

5. The process according to claim 1 wherein said first conductive layer is formed of a material selected from a group consisting of chromium, molybdenum, tantalum molybdenum, tungsten molybdenum, tantalum, aluminum, aluminum silicide and copper.

6. The process according to claim 5 wherein said second conductive layer is formed of a material selected from a group consisting of chromium, molybdenum, tantalum molybdenum, tungsten molybdenum, tantalum, aluminum, aluminum silicide and copper.

7. The process according to claim 6 wherein a specific etching selectivity between said first conductive layer and said second conductive layer prevents said first conductive layer from being etched by an etchant of said second conductive layer.

8. The process according to claim 7 wherein said first conductive layer is formed of chromium, and said second conductive layer is formed of aluminum.

9. The process according to claim 7 wherein said first conductive layer is formed of tungsten molybdenum, and said second conductive layer is formed of aluminum.

10. The process according to claim 1 wherein said insulation layer is formed of a material selected from a group consisting of silicon nitride, silicon oxide, silicon oxynitride, tantalum oxide and aluminum oxide.

11. The process according to claim 1 wherein said semiconductor layer is formed of a material selected from a group consisting of intrinsic amorphous silicon, micro-crystalline silicon and polysilicon.

12. The process according to claim 1 wherein said etch stopper layer is formed of a material selected from a group consisting of silicon nitride, silicon oxide, and silicon oxynitride.

13. The process according to claim 1 wherein said doped semiconductor layer is formed of a material selected from a group consisting of highly doped amorphous silicon, doped micro-crystalline silicon and doped polysilicon.

14. The process according to claim 1 wherein said passivation layer is formed of a material selected from a group consisting of silicon nitride and silicon oxynitride.

15. The process according to claim 1 wherein after said fourth masking and patterning procedure, a portion of said first conductive layer surrounding said pixel electrode remains as a black matrix.

16. The process according to claim 1 wherein said first masking and patterning procedure additionally defines a plurality of pad regions around said TFT matrix.

17. The process according to claim 16 wherein said second masking and patterning procedure additionally defines a plurality of contact via to expose said pad regions.

* * * * *